United States Patent
Wu et al.

(10) Patent No.: US 9,582,361 B2
(45) Date of Patent: Feb. 28, 2017

(54) FIXED POINT CONVERSION OF LLR VALUES BASED ON CORRELATION

(71) Applicant: Seagate Technology LLC, Cupertino, CA (US)

(72) Inventors: Yunxiang Wu, Cupertino, CA (US); Yu Cai, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 261 days.

(21) Appl. No.: 14/282,380

(22) Filed: May 20, 2014

(65) Prior Publication Data

US 2015/0339189 A1    Nov. 26, 2015

(51) Int. Cl.
| | | |
|---|---|---|
| *G06F 11/10* | (2006.01) | |
| *H03M 13/00* | (2006.01) | |
| *H03M 13/11* | (2006.01) | |
| *H03M 13/39* | (2006.01) | |

(52) U.S. Cl.
CPC .......... *G06F 11/1076* (2013.01); *G06F 11/10* (2013.01); *H03M 13/112* (2013.01); *H03M 13/3927* (2013.01); *H03M 13/658* (2013.01); *G06F 11/1004* (2013.01); *G06F 11/1008* (2013.01); *H03M 13/1111* (2013.01); *H03M 13/1117* (2013.01); *H03M 13/3905* (2013.01); *H03M 13/6577* (2013.01); *H03M 13/6588* (2013.01); *H03M 13/6591* (2013.01)

(58) Field of Classification Search
CPC ...... G06F 11/08; G06F 11/10; G06F 11/1004; G06F 11/1008; H03M 13/05; H03M 13/11; H03M 13/1102; H03M 13/1105; H03M 13/1108; H03M 13/1111; H03M 13/1117; H03M 13/112; H03M 13/39; H03M 13/3905; H03M 13/3927; H03M 13/6502; H03M 13/6577; H03M 13/658; H03M 13/653; H03M 13/6566; H03M 13/6591
See application file for complete search history.

(56) References Cited

U.S. PATENT DOCUMENTS

| | | | |
|---|---|---|---|
| 8,255,758 B2 | 8/2012 | Anholt et al. | 714/752 |
| 8,543,891 B2 | 9/2013 | Anholt et al. | 714/758 |
| 8,601,352 B1 | 12/2013 | Anholt et al. | 714/790 |
| 8,640,002 B1 | 1/2014 | Varanasi | 714/758 |

(Continued)

*Primary Examiner* — Albert Decady
*Assistant Examiner* — Christian Dorman
(74) *Attorney, Agent, or Firm* — Christopher P. Maiorana, PC

(57) ABSTRACT

An apparatus comprising a memory and a controller. The memory may be configured to process a plurality of read/write operations. The memory comprises a plurality of memory units each having a size less than a total size of the memory. The controller may be configured to perform error correction code decoding on the memory units. The controller may be configured to generate a plurality of original log likelihood ratios each comprising a real value. The controller may be configured to convert each of the original log likelihood ratios to a converted log likelihood ratio comprising a fixed point value. The conversion comprises (a) scaling down a magnitude of each of the original log likelihood ratios, and (b) rounding each of the original log likelihood ratios having a scaled down magnitude to the fixed point value.

20 Claims, 7 Drawing Sheets

(56) References Cited

U.S. PATENT DOCUMENTS

| | | | |
|---|---|---|---|
| 8,667,360 B2 | 3/2014 | Motwani | 714/752 |
| 9,059,742 B1 * | 6/2015 | Anderson | H03M 13/1111 |
| 2007/0110191 A1 * | 5/2007 | Kim | H04L 1/0052 |
| | | | 375/340 |
| 2010/0088575 A1 * | 4/2010 | Sharon | G06F 11/1072 |
| | | | 714/763 |
| 2010/0169734 A1 * | 7/2010 | Gamage | H03M 13/1105 |
| | | | 714/752 |
| 2012/0311402 A1 | 12/2012 | Tseng et al. | 714/763 |
| 2013/0212451 A1 | 8/2013 | Nemati Anaraki et al. | 714/773 |
| 2013/0238952 A1 | 9/2013 | Varanasi | 714/755 |
| 2013/0275829 A1 | 10/2013 | Sridhara et al. | 714/755 |
| 2013/0339815 A1 | 12/2013 | Anholt et al. | 714/752 |
| 2013/0339817 A1 | 12/2013 | Kwok | 714/752 |
| 2015/0200688 A1 * | 7/2015 | Pan | H03M 13/3927 |
| | | | 714/794 |

* cited by examiner

FIXED POINT CONVERSION OF LLR VALUES BASED ON CORRELATION

FIELD OF THE INVENTION

The invention relates to data storage generally and, more particularly, to a method and/or apparatus for implementing a fixed point conversion of LLR values based on correlation.

BACKGROUND

Due to aggressive process scaling, the raw bit error rate (BER) of NAND flash is becoming poorer and poorer. To maintain the same level of reliability, solid state drive (SSD) controllers are adopting error correction codes with soft decoding capability. For example, low density parity check (LDPC) codes have soft decoding capability. Error correction codes with soft decoding capability are more powerful in correcting errors but they use a soft input to the decoder. The soft input is in the form of a log likelihood ratio (LLR). Since conventional flash devices do not provide soft decision outputs, SSD controllers have to generate them using either hardware or software. LLR values are real values ranging from −Inf to +Inf. Once LLRs are generated, there is a practical problem of converting LLRs to fixed point numbers before decoding.

It would be desirable to implement fixed point conversion of LLR values based on correlation in a SSD controller and/or drive.

SUMMARY

The invention concerns an apparatus comprising a memory and a controller. The memory may be configured to process a plurality of read/write operations. The memory comprises a plurality of memory units each having a size less than a total size of the memory. The controller may be configured to perform error correction code decoding on the memory units. The controller may be configured to generate a plurality of original log likelihood ratios each comprising a real value. The controller may be configured to convert each of the original log likelihood ratios to a converted log likelihood ratio comprising a fixed point value. The conversion comprises (a) scaling down a magnitude of each of the original log likelihood ratios, and (b) rounding each of the original log likelihood ratios having a scaled down magnitude to the fixed point value.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a fixed point conversion of LLR values based on correlation that may (i) map continuous LLR values to fixed point integers, (ii) be implemented using a linear correlator, (iii) determine an optimal scalar value, (iv) update an optimal scalar value over the lifetime of the SSD, (v) correlate LLR values to the input precision of a decoder, and/or (vi) be implemented as one or more integrated circuits.

Embodiments of the invention may handle the problem of converting LLRs to fixed point numbers before decoding. Generally, LLRs have real (e.g., continuous) values ranging from −Inf to +Inf. A linear correlator may select converted fixed point values. The original (e.g., real and/or continuous) LLRs may be mapped to fixed point integers (e.g., converted LLRs). The conversion of the original LLRs to converted LLRs may be implemented using correlation. The converted LLRs having fixed point values may be sent for error correction code decoding.

Figure 1:
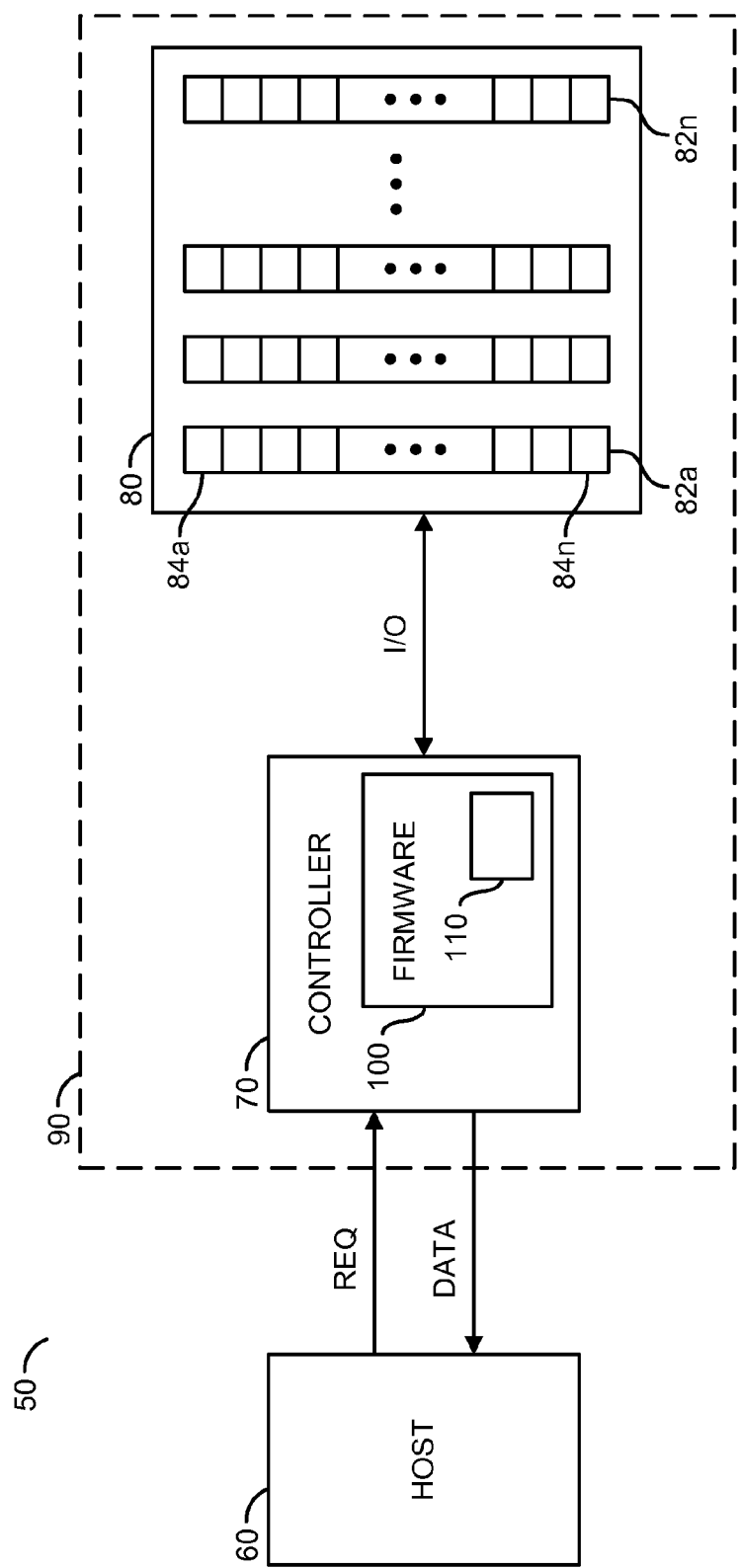
FIG. 1 is a diagram illustrating an example embodiment.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units, such as die, plane, block, and/or page units. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. A SLC type circuit generally stores a single bit per memory cell (e.g., a logical 0 or 1). In other embodiments, the circuit 80 may be implemented as a multi-level cell (e.g., MLC) type circuit. A MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111). In yet another embodiment, the circuit 80 may implement a circuit with a cell level greater than a triple-level cell. Generally, the circuit 80 may be implemented as an n-level cell capable of storing n-bits per memory cell.

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

Figure 2:
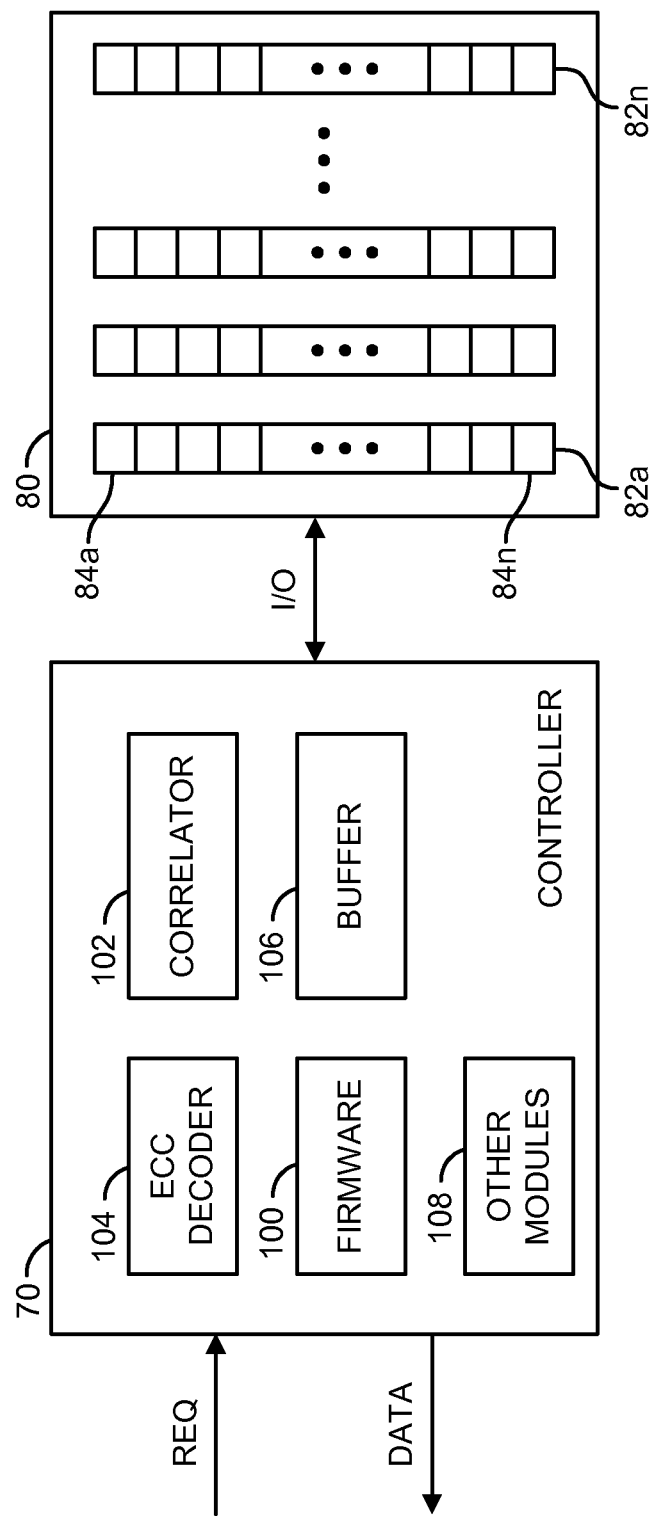
FIG. 2 is a diagram illustrating a more detailed embodiment.

The drive 90 may contain, in one example, multiple NAND Flash or memory modules 82a-82n. Each of the memory modules 82a-82n may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD 90 receives the host command REQ, in order to achieve the best performance, and/or to address wear leveling issues, the drive 90 will walk through all of the dies 82a-82n (e.g., a first page of DIE0, DIE1 . . . DIEn, then a next page of DIE0), Referring to FIG. 2, a diagram illustrating a more detailed embodiment is shown. The controller 70 is shown connected to the memory circuit 80. The controller 70 generally comprises the firmware 100, a block (or circuit) 102, a block (or circuit) 104, a block (or circuit) 106, and a block (or circuit) 108. The circuit 102 may be a correlator. For example, the correlator 102 may be a linear correlator. The circuit 104 may be an ECC decoder. The circuit 106 may be a buffer. The circuit 108 may represent other modules.

The ECC decoder 104 may be configured to perform error correction code decoding with soft decoding capability. Generally, the ECC decoder 104 is implemented using digital circuits. For example, the decoder 104 may be configured to generate low density parity check codes. Error correction codes with soft decoding capability may need soft input in the form of LLRs. The ECC decoder may have an input precision (e.g., 4-bits, 3-bits, etc.). Before LLRs are sent to the decoder 104, the LLRs may be converted to fixed-point numbers by the correlator 102.

The correlator 102 may convert LLRs to fixed-point values. The conversion may determine which original LLR value to map to a specific fixed-point value. For example, the correlator 102 may convert the LLR to correspond with the input precision (e.g., 4-bits) of the ECC decoder 104. The correlator 102 may scale down the magnitude of the original LLR values. The correlator 102 may determine a best scalar value. The correlator 102 may clip the scaled LLRs and round the scaled LLRs to integer values. Generally, when the input precision of the ECC decoder 104 is lower, heavier scaling is needed from the correlator 102. Heavier scaling may result in more rounding noise.

The controller 70 may generate LLRs. Generally, generating LLRs involves two steps. First, the desired read reference voltages are set based on the criterion of maximizing mutual information. Second, the LLRs are either generated by calculation if cell voltage distributions are known (or measured) when read back data is available.

Figure 3:
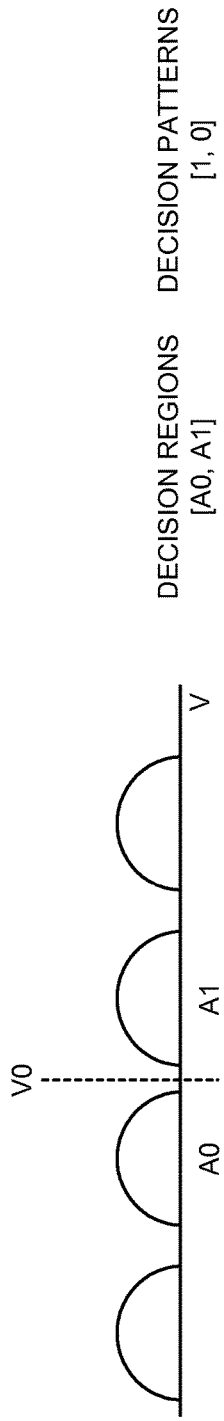
FIG. 3 is a diagram illustrating read reference voltages and decision regions when reading a single voltage.

Referring to FIG. 3, a diagram illustrating read reference voltages and decision regions when reading a single voltage is shown. The read reference voltages (e.g., Vrefs), decision regions, and the corresponding decision patterns when the least-significant bit (LSB) pages of the MLC flash are read are shown. Four voltage distributions from left to right may be mapped to "11", "01", "00" and "10", respectively. For an example of reading a single voltage (e.g., V0), the voltage axis (e.g., the horizontal axis V) is divided into two decision regions (e.g., A0, and A1). Corresponding decision patterns may be 1 for the region A0, and 0 for the region A1. Soft decisions corresponding to 0 or 1 may be obtained if the four distribution parameters are considered. The soft decision with a single read is a fairly rough approximation. A higher quality of soft decisions may be obtained with more reads.

Figure 4:
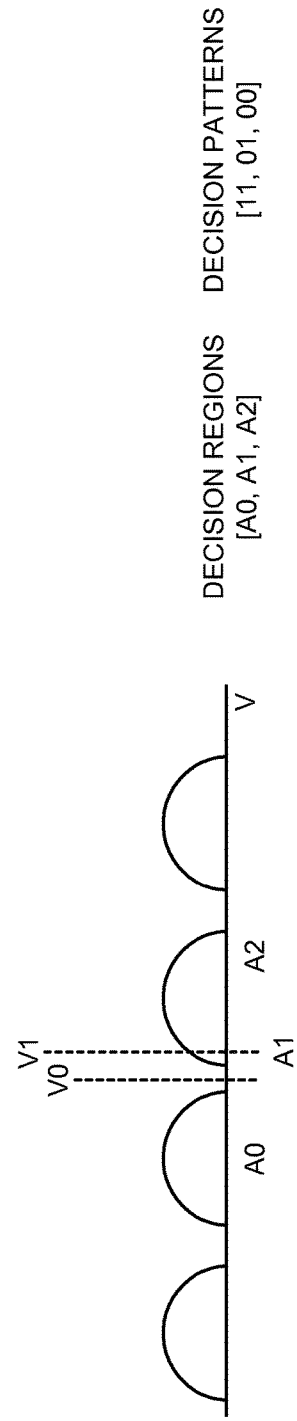
FIG. 4 is a diagram illustrating read reference voltages and decision regions when reading two voltages.

Referring to FIG. 4, a diagram illustrating read reference voltages and decision regions when reading two voltages is shown. The read reference voltages (e.g., Vrefs), decision regions, and the corresponding decision patterns when LSB pages of MLC flash are read are shown. Four voltage distributions from left to right may be mapped to "11", "01", "00" and "10", respectively. For an example of reading two voltages (e.g., V0, and V1), the voltage axis (e.g., the horizontal axis V) is divided into three decision regions (e.g., A0, A1, and A2). Corresponding decision patterns may be 11 for the region A10, 01 for the region A1, and 00 for the region A2.

Figure 5:
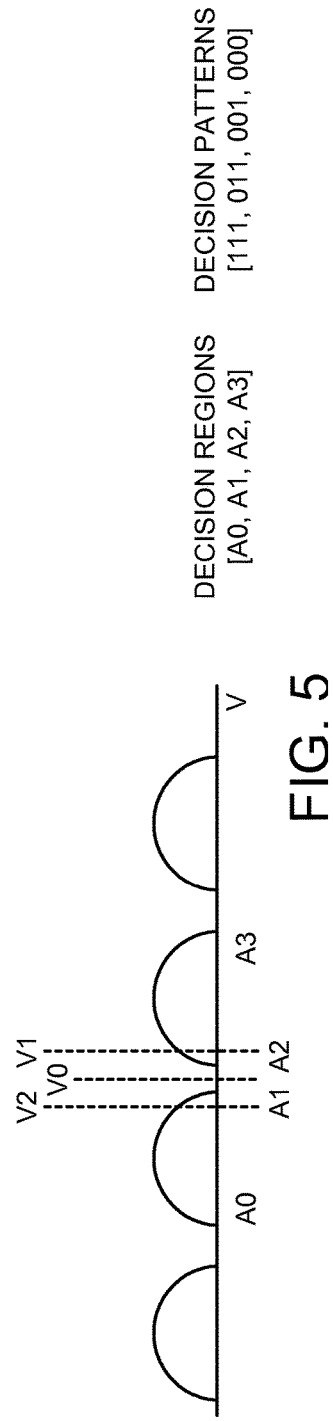
FIG. 5 is a diagram illustrating read reference voltages and decision regions when reading three voltages.

Referring to FIG. 5, a diagram illustrating read reference voltages and decision regions when reading three voltages is shown. The read reference voltages (e.g., Vrefs), decision regions, and the corresponding decision patterns when LSB pages of MLC flash are read are shown. Four voltage distributions from left to right may be mapped to "11", "01", "00" and "10", respectively. For an example of reading three voltages (e.g., V0, V1, and V2), the voltage axis (e.g., the horizontal axis V) is divided into four decision regions (e.g., A0, A1, A2, and A3). Corresponding decision patterns may be 111 for the region A0, 011 for the region A1, 001 for the region A2, and 000 for the region A3.

A read operation of a NAND flash device (e.g., the memory 80) may include a process for applying threshold detection. Implementing multiple reads with varying read threshold voltages is equivalent to applying multiple threshold detection operations. The cell voltage is quantized into more than two regions leading to more than two decision patterns, as shown in FIG. 4 and FIG. 5. The decision patterns are hard decisions. A soft decision may be calculated corresponding to each decision pattern. The soft decisions are usually in the form of LLR values Generally, the number of decision patterns for N reads of a lower page (e.g., a LSB page) is N+1. Generally, for a most-significant bit (e.g., MSB) page with conventional Gray coding, there may be a maximum of 2*N hard decision patterns. For example, a pair of read voltages is used for each read operation.

Generally, each of the decision regions may have an associated LLR value. The associated LLR value may be an original LLR value. An original LLR value may be a real value number ranging from −Inf to +Inf.

Figure 6:
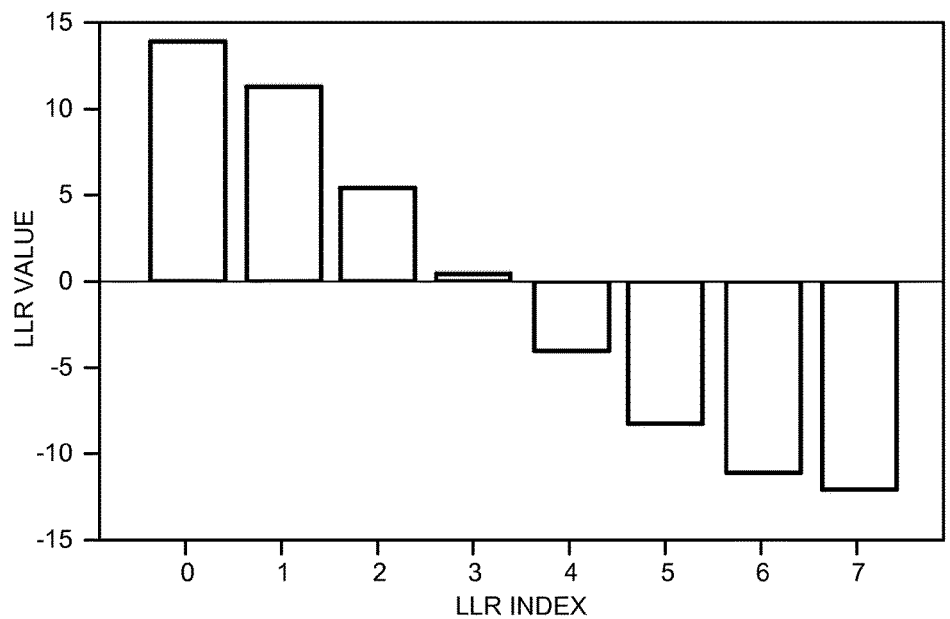
FIG. 6 is a diagram illustrating a graph of LLR values for reads of pages.

Referring to FIG. 6, a diagram illustrating a graph of LLR values for reads of pages is shown. The graph shows an example of original LLR values for seven reads of LSB pages. For example, the original LLR with LLR index position 0 may have a real value of approximately 14.5. In another example, the original LLR with LLR index position 1 may have a real value of approximately 10.2. Similarly, the original LLRs with index positions 2-7 have real values.

The original LLRs having real values may be converted by the correlator 102 to fixed-point (e.g., integer) values before being sent to the decoder 104. The original LLRs may need to be converted to fixed-point values since the decoder 104 may consist of digital circuits.

In one example embodiment, the decoder 104 may be configured to receive 4-bit fixed-point numbers as inputs. A 4-bit number has 2^4 possible integer values (e.g., ranging from −8 to 7). The conversion of an original LLR to a fixed-point number may be a mapping that determines which original LLR having a real value is mapped to which integer (e.g., fixed-point) value. For example, some of the original LLRs shown in FIG. 6 are outside of the range of −8 to 7 (e.g., the original LLR with LLR index position 1 is shown having a real value of 10.2).

The original LLR values may be converted to fixed-point integers (e.g., by the correlator 102). A scalar may be implemented to scale down the magnitude of the original LLR value. A version of the original LLR value having a scaled down magnitude may be clipped and/or rounded to an integer value. The LLR that has been scaled down, clipped, and/or rounded to an integer value may be a converted LLR.

Generally, since min-sum decoding is linear, the scaling operation does not affect the decoded BER. An appropriate value for a scalar may be determined. The appropriate value for the scalar may be determined using the linear correlator 102. The linear correlator 102 may calculate correlation coefficients between the original LLRs (e.g., as a sequence) and the converted LLRs (e.g., fixed-point integers).

Generally, correlation coefficients may be a measure of "similarity" between two sequences. Selecting a scalar value that gives the largest correlation coefficient may keep the converted LLRs "similar" to the original LLRs. For example, the scalar giving the largest correlation coefficient may be the best scalar. The value of the best scalar may change based on the operating conditions of the SSD 90. For example, the best scalar may minimize the distortion to the original LLRs introduced by the conversion to the converted LLRs.

Figure 7:
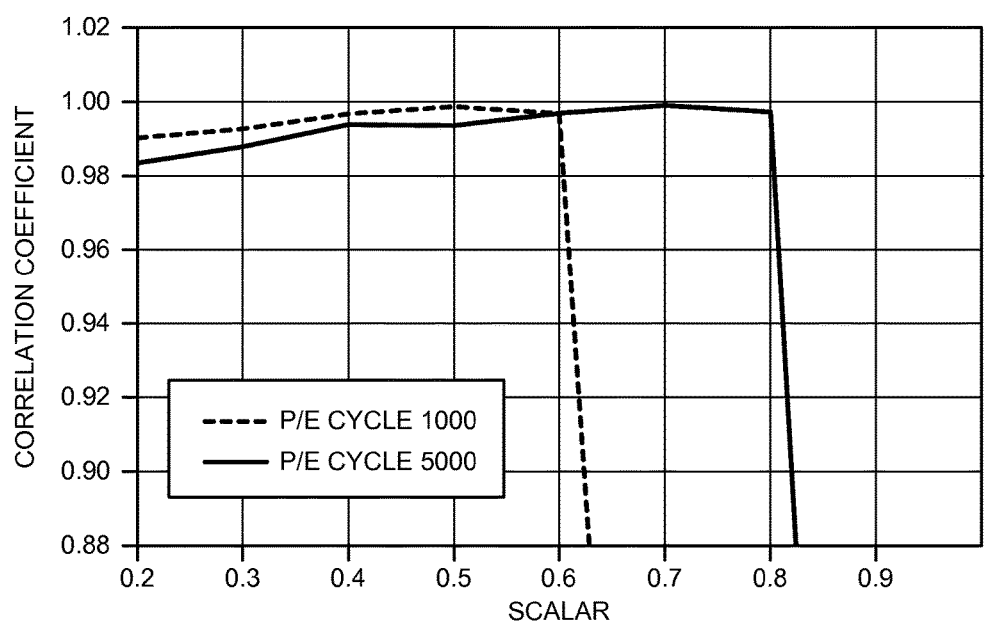
FIG. 7 is a diagram illustrating a graph of correlation coefficients versus scalar values.

Referring to FIG. 7, a diagram illustrating a graph of correlation coefficients versus scalar values for a 4-bit input precision is shown. The y-axis may represent the correlation coefficient values. The x-axis may represent the scalar values. The correlation coefficient values versus scalar values of 0.2 to for program/erase (e.g., P/E) cycles of 1000 and 5000 are plotted. Generally, the best scalar value is the scalar value resulting in a correlation coefficient closest to 1. For example, the best scalar value for P/E cycles of 1000 is 0.5. In another example, the best scalar value for P/E cycles of 5000 is 0.7.

Generally, when the P/E cycle amount is smaller, the values of LLRs have a larger magnitude. A larger magnitude may need more scaling to reduce the distortion caused by clipping. For example, with 1000 P/E cycles a best scalar value of 0.5 results in more scaling than the best scalar value 0.7 with 5000 P/E cycles. In alternate embodiments, an alternate input precision for the decoder 104 may be implemented. For example, a 3-bit input precision may result in heavier (e.g., larger) scaling. With heavier scaling, the noise caused by rounding may be more significant.

Figure 8:
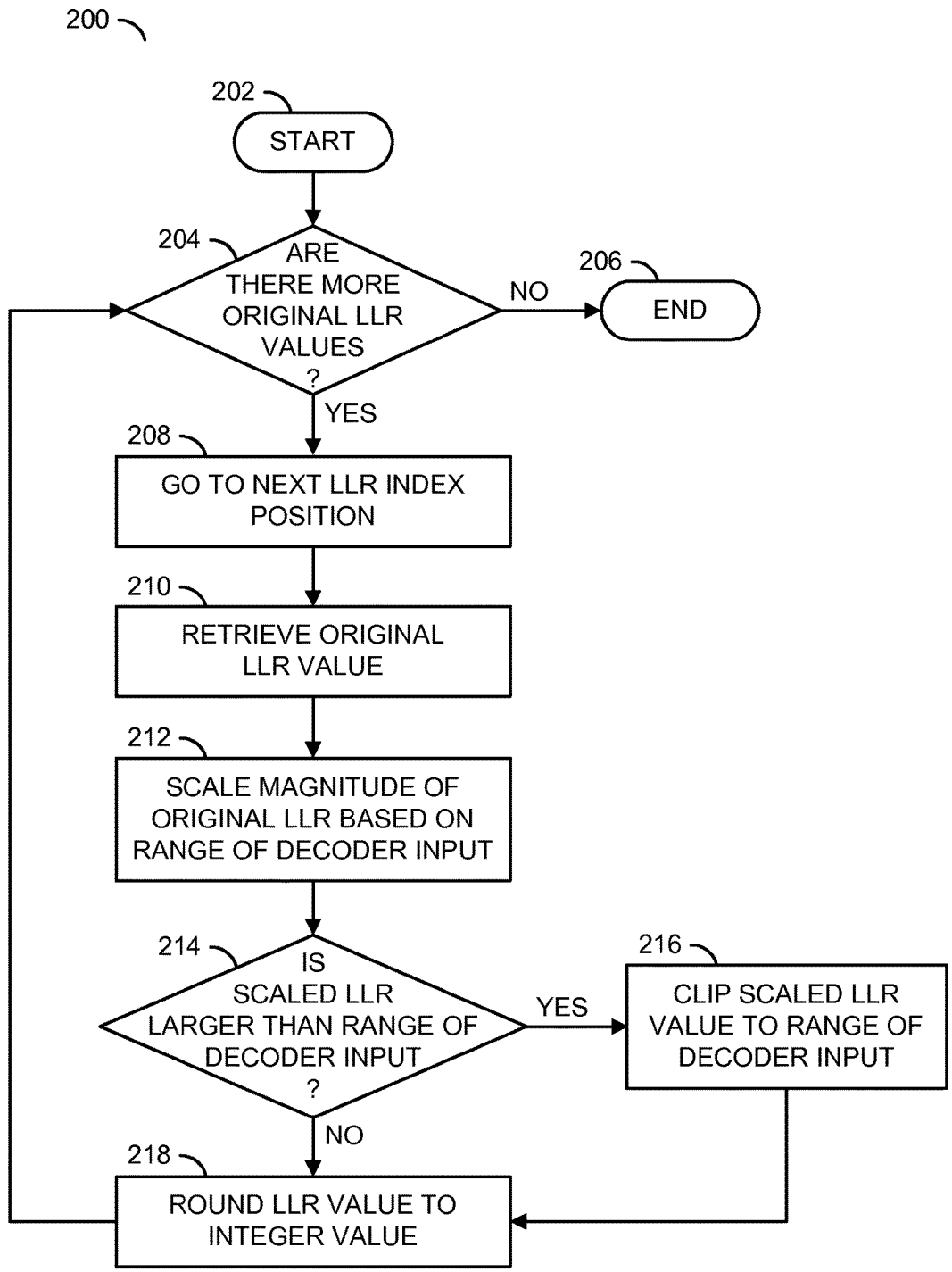
FIG. 8 is a flow diagram illustrating converting original LLR values to fixed point LLR values.

Referring to FIG. 8, a flow diagram illustrating a method (or process) 200 is shown. The method 200 may convert original LLR values to fixed point LLR values. The method 200 generally comprises a step (or state) 202, a decision step (or state) 204, a step (or state) 206, a step (or state) 208, a step (or state) 210, a step (or state) 212, a decision step (or state) 214, a step (or state) 216, and a step (or state) 218.

The state 202 may start the method 200. Next, the decision state 204 may determine whether there are more original LLR values. If not, the method 200 moves to the state 206, which ends the method 200. If so, the method 200 moves to the state 208. The state 208 may go to the next LLR index position. Next, the state 210 may retrieve the original LLR value. The state 212 may scale the magnitude of the original LLR value based on the range of the decoder input (e.g., the ECC decoder 104). Next, the method 200 moves to the decision state 214.

If the decision state 214 determines the scaled LLR is larger than the range of the decoder input (e.g., the ECC decoder 104), the method 200 moves to the state 216. The state 216 may clip the scaled LLR value to the range of the decoder input (e.g., the ECC decoder 104). Next, the method 200 moves to the state 218. If the decision state 214 determines the scaled LLR value is not larger than the range of the decoder input (e.g., the ECC decoder 104), the method 200 moves to the state 218. The state 218 may round the LLR value to an integer (e.g., fixed point) value. Next, the method 200 returns to the decision state 204.

Generally, the magnitude of the original LLR values are larger than the range of the input (e.g., the input precision) of the ECC decoder 104. The original LLR values may be scaled first. If the magnitude of the scaled LLR values are still larger than the range of the input of the ECC decoder 104, then the LLR values may be clipped.

For example, after scaling the original LLR values the scaled LLR values may be within the input range of the ECC decoder 104, and the scaled LLR values may not need to be clipped. In another example, after scaling the original LLR values the scaled LLR values may not be within the input range of the ECC decoder 104, and the scaled LLR values may be clipped. The range of the decoder input may be determined by the input precision of the ECC decoder 104. Original LLR values may be scaled and/or clipped before being rounded to a fixed-point value so that the converted LLR values may be similar to the original LLR value (e.g., to maximize the correlation).

Figure 9:
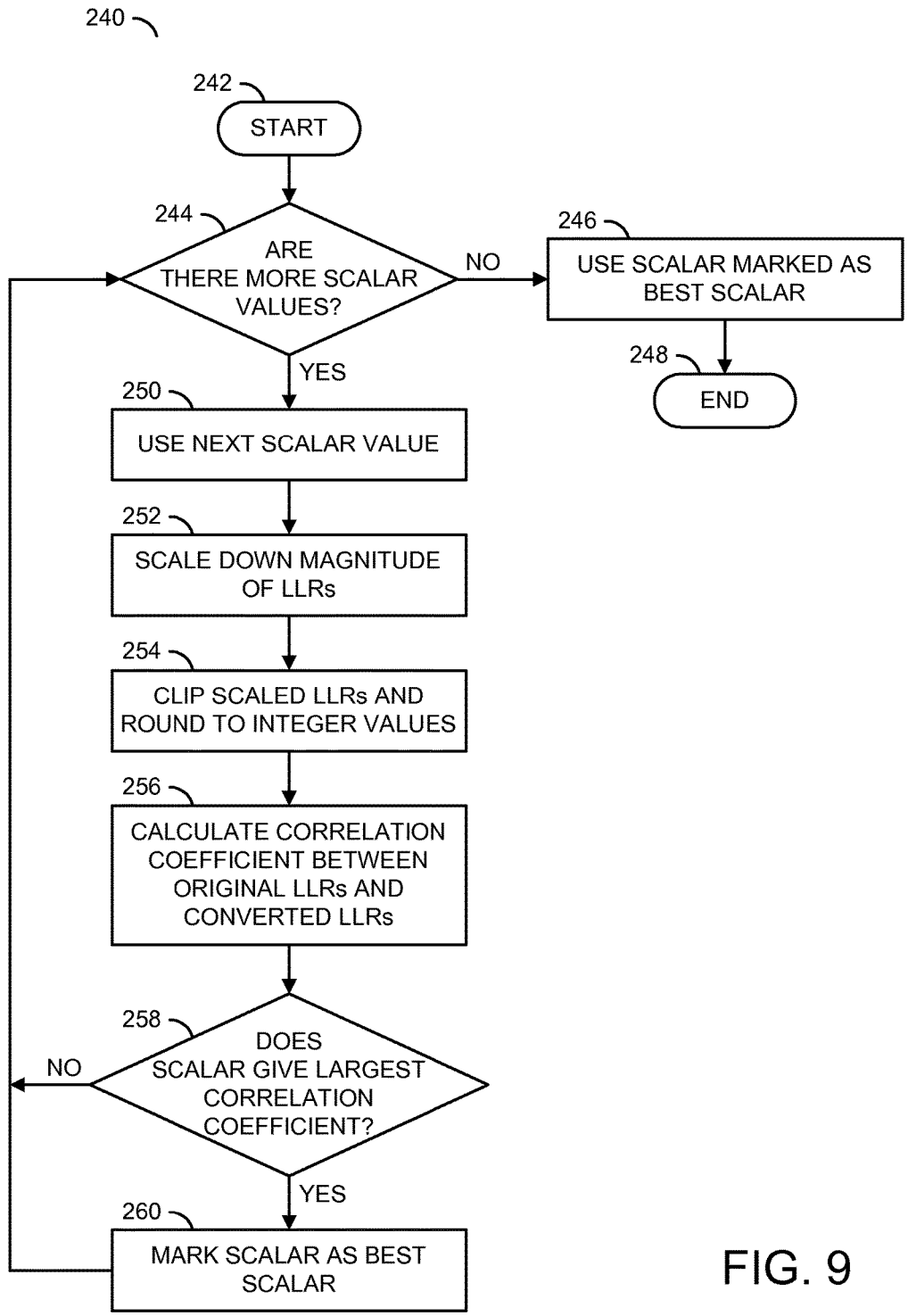
FIG. 9 is a flow diagram illustrating determining the best scalar value.

Referring to FIG. 9, a flow diagram illustrating a method (or process) 240 is shown. The method 240 may determine the best scalar value. The method 240 generally comprises a step (or state) 242, a decision step (or state) 244, a step (or state) 246, a step (or state) 248, a step (or state) 250, a step (or state) 252, a step (or state) 254, a step (or state) 256, a decision step (or state) 258, and a step (or state) 260.

The state 242 may start the method 240. Next, the decision state 244 may determine whether there are more scalar values. If so, the method 240 moves to the state 250. If not, the method 240 moves to the state 246. The state 246 may use the scalar marked as the best scalar. Next, the state 248 may end the method 240.

The state 250 may use the next scalar value. Next, the state 252 may scale down the magnitude of LLRs (e.g., the original LLRs may be scaled down). The state 254 may clip scaled LLRs and round to integer values (e.g., converted LLRs). The state 256 may calculate a correlation coefficient between the original LLRs and the converted LLRs. Next, the method 240 moves to the decision state 258. If the decision state 258 determines the scalar does not give the largest correlation coefficient, the method 240 returns to the decision state 244. If the decision state 258 determines the scalar does give the largest correlation coefficient, the method 240 moves to the state 260. The state 260 may mark the scalar as the best scalar. Next, the method 240 returns to the decision state 244.

Generally, optimal LLR values change with the use of the SSD 90. During the life time of the SSD 90, the LLRs may be updated by the SSD controller 70. When the LLRs are updated by the SSD controller 70, a new best scalar value may be determined. The new best scalar value may be determined by the correlator 102 by calculating the correlation coefficient for various scalar values (as shown in FIG. 7).

Figure 10:
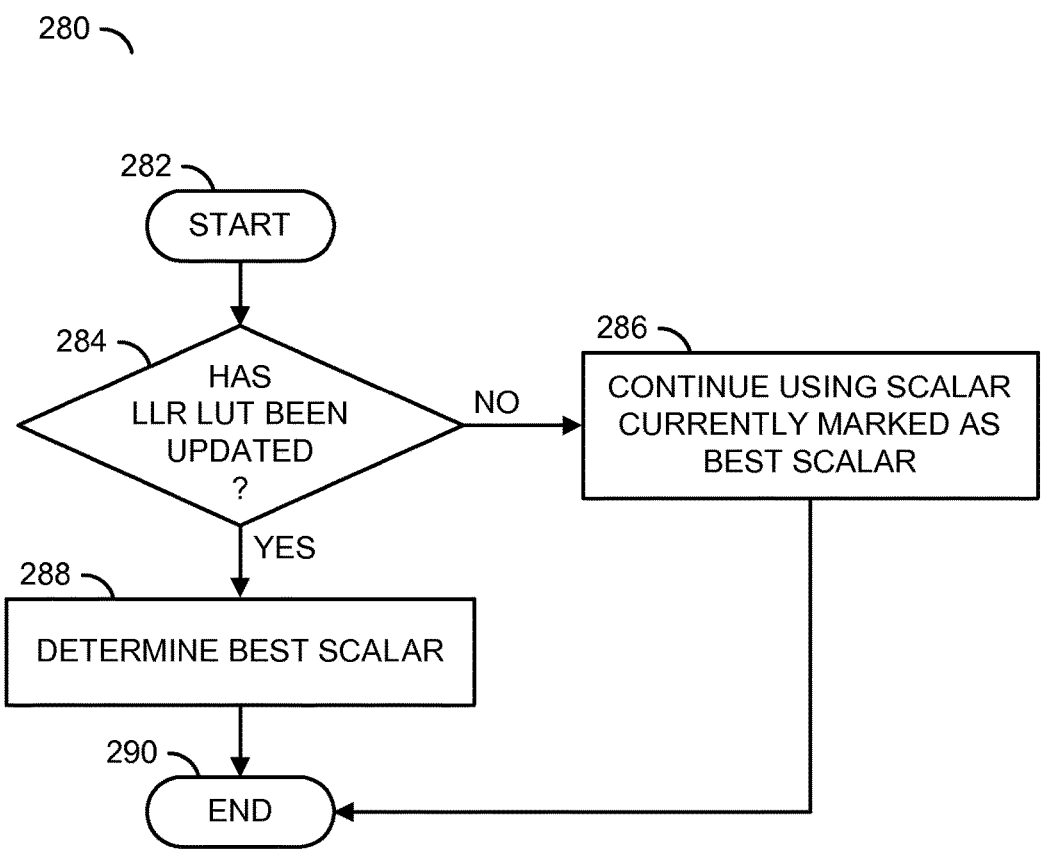
FIG. 10 is a flow diagram illustrating triggering the determination of a new scalar value.

Referring to FIG. 10, a method (or process) 280 is shown. The method 280 may illustrate triggering the determination of a new scalar value. The method 280 generally comprises a step (or state) 282, a decision step (or state) 284, a step (or state) 286, a step (or state) 288, and a step (or state) 290.

The state 282 may start the method 280. Next, the method 280 moves to the decision state 284. If the decision state 284 determines the LLR lookup tables (LUT) has not been updated, the method 280 moves to the state 286. The state 286 may continue using the scalar currently marked as the best scalar. Next, the method 280 moves to the state 290, which ends the method 280. If the decision state 284 determines the LLR lookup tables (LUT) has been updated, the method 280 moves to the state 288. The state 288 may determine the best scalar (e.g., as described in FIG. 9). Next, the method 280 moves to the state 290, which ends the method 280.

Generally, the event of updating LLR LUTs may trigger determining a new best scalar value. The SSD 90 may be manufactured having LLR LUTs. The LLR LUTs may be updated during the lifetime of the SSD 90. For example, an update to the firmware 100 may provide new/updated LLR LUTs. In another example, the LLR LUTs may be updated based on a number of program/erase cycles.

When the best scalar is determined by the correlator 102, the measured LLRs (e.g., the original LLR values having a high precision) may be converted to the size of the corresponding input precision of the decoder 104 (e.g., 4-bits) by clipping and/or rounding. For this purpose, the correlator 102 may be implemented by either firmware and/or hardware. Generally, the number of LLRs is not large. Since the number of LLRs is not large, the computation involved may be very light. The original LLR values may be calculated and/or measured. The original LLR values may be continuous values that may not be used directly by the ECC decoder 104. To convert the original LLR values to converted LLR values with a maximum correlation, a best scalar value may be determined.

The functions performed by the diagrams of FIGS. 8-10 may be implemented using one or more of a conventional general purpose processor, digital computer, microprocessor, microcontroller, RISC (reduced instruction set computer) processor, CISC (complex instruction set computer) processor, SIND (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multichip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a memory configured to store data, the memory comprising a plurality of memory units each having a size less than a total size of the memory; and
a controller configured to process a plurality of read/write operations, perform error correction code decoding on the memory units, generate a set of original log likelihood ratios each comprising a real value, and convert each of the original log likelihood ratios to generate a set of converted log likelihood ratios each comprising a fixed point value, wherein
the controller determines a selected scalar value by generating a plurality of sets of scaled log likelihood ratios by scaling the set of original log likelihood ratios with a plurality of corresponding scalar values, calculates a plurality of respective correlation coefficients each measuring a similarity of a respective set of scaled log likelihood ratios to the set of original log likelihood ratios, and selects the scalar value corresponding to the set of scaled log likelihood ratios whose respective correlation coefficient is highest as the selected scalar value; and
the conversion of the set of original log likelihood ratios comprises scaling down a magnitude of each of the original log likelihood ratios using the selected scalar value and rounding each of the original log likelihood ratios having a scaled down magnitude to the fixed point value.

2. The apparatus according to claim 1, wherein the conversion further comprises clipping the original log likelihood ratios having the scaled down magnitude before the rounding.

3. The apparatus according to claim 2, wherein the clipping is performed if the magnitude of the original log likelihood ratios after the scaling is outside of a range of input of a decoder within the controller.

4. The apparatus according to claim 1, wherein the controller is further configured to process each of the converted log likelihood ratios using a decoder within the controller.

5. The apparatus according to claim 4, wherein the original log likelihood ratios are converted to the converted log likelihood ratios before being sent to the decoder.

6. The apparatus according to claim 4, wherein the fixed point values of the converted log likelihood ratios are based on an input precision of the decoder.

7. The apparatus according to claim 1, wherein the memory and the controller are part of a solid state drive (SSD).

8. The apparatus according to claim 1, wherein the correlation coefficients are calculated by a linear correlator.

9. The apparatus according to claim 8, wherein the linear correlator is implemented in hardware.

10. The apparatus according to claim 8, wherein the linear correlator is implemented in a firmware of the controller.

11. The apparatus according to claim 1, wherein the original log likelihood ratios are stored in a log likelihood ratio lookup table of the apparatus.

12. The apparatus according to claim 11, wherein the correlation coefficient minimizes a distortion of the original log likelihood ratios caused by the conversion.

13. The apparatus according to claim 1, wherein the value of the selected scalar changes over a lifetime of the apparatus.

14. The apparatus according to claim 11, wherein the value of the selected scalar changes when the log likelihood ratio lookup table of the apparatus is changed.

15. The apparatus according to claim 1, wherein the error correction code decoding implements a soft decoding capability.

16. The apparatus according to claim 1, wherein the error correction code decoding performed by the controller has a decoded bit error rate that is unaffected by the scaling down of the magnitude of each of the original log likelihood ratios.

17. A method to convert log likelihood ratios, comprising the steps of:
configuring a memory to process a plurality of read/write operations, the memory comprising a plurality of memory units each having a size less than a total size of the memory;
performing error correction code decoding on the memory units;
generating a set of original log likelihood ratios each comprising a real value; and
converting each of the original log likelihood ratios to generate a set of converted log likelihood ratios each comprising a fixed point value, wherein a selected scalar value is determined by generating a plurality of sets of scaled log likelihood ratios by scaling the set of original log likelihood ratios with a plurality of corresponding scalar values, calculates a plurality of respective correlation coefficients each measuring a similarity of a respective set of scaled log likelihood ratios to the set of original log likelihood ratios, and selects the scalar value corresponding to the set of scaled log likelihood ratios whose respective correlation coefficient is highest as the selected scalar value, the conversion of the set of original log likelihood ratios comprises scaling down a magnitude of each of the original log likelihood ratios using the selected scalar value, and rounding each of the original log likelihood ratios having a scaled down magnitude to the fixed point value.

18. The method according to claim 17, wherein the converting step further comprises clipping the original log likelihood ratios having the scaled down magnitude before the rounding.

19. An apparatus comprising:
an interface configured to process a plurality of read/write operations to/from a memory; and a control circuit configured to perform error correction code decoding on the memory, generate a set of original log likelihood ratios each comprising a real value, and convert each of the original log likelihood ratios to generate a set of converted log likelihood ratios each comprising a fixed point value, wherein the control circuit determines a selected scalar value by generating a plurality of sets of scaled log likelihood ratios by scaling the set of original log likelihood ratios with a plurality of corresponding scalar values, calculates a plurality of respective correlation coefficients each measuring a similarity of a respective set of scaled log likelihood ratios to the set of original log likelihood ratios, and selects the scalar value corresponding to the set of scaled log likelihood ratios whose respective correlation coefficient is highest as the selected scalar value, the conversion of the set of original leg likelihood ratios comprises scaling down a magnitude of each of the original log likelihood ratios, and rounding each of the original log likelihood ratios having a scaled down magnitude to the fixed point value.

20. The apparatus according to claim 19, wherein the conversion further comprises clipping the original log likelihood ratios having the scaled down magnitude before the rounding.

\* \* \* \* \*